US012701959B2

(12) United States Patent
Park et al.

(10) Patent No.: US 12,701,959 B2
(45) Date of Patent: Aug. 4, 2026

(54) WAFER STORAGE AND TRANSPORT SYSTEM AND METHOD OF OPERATION OF WAFER STORAGE AND TRANSPORT SYSTEM

(71) Applicant: SAMSUNG ELECTRONICS CO., LTD., Suwon-si (KR)

(72) Inventors: Sang Hyuk Park, Suwon-si (KR); Youn Gon Oh, Suwon-si (KR); Hyuk Kwon, Suwon-si (KR); Young-Kyu Kim, Suwon-si (KR); Ji Hun Kim, Suwon-si (KR); Sung-Hoon Lee, Suwon-si (KR); Jeong Kwan Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 539 days.

(21) Appl. No.: 18/195,757

(22) Filed: May 10, 2023

(65) Prior Publication Data
US 2024/0006215 A1 Jan. 4, 2024

(30) Foreign Application Priority Data
Jul. 1, 2022 (KR) ........................ 10-2022-0081383

(51) Int. Cl.
H10P 72/30 (2026.01)

(52) U.S. Cl.
CPC ...... H10P 72/3221 (2026.01); H10P 72/3202 (2026.01); H10P 72/3218 (2026.01); H10P 72/3222 (2026.01); H10P 72/3404 (2026.01)

(58) Field of Classification Search
CPC ........... H01L 21/6773; H01L 21/67706; H01L 21/67733; H01L 21/67736; H01L 21/67769; H10P 72/3218; H10P 72/3202; H10P 72/3221; H10P 72/3222; H10P 72/3404
See application file for complete search history.

(56) References Cited

U.S. PATENT DOCUMENTS

| 9,263,311 B2 | 2/2016 | Ota et al. |
| 9,385,019 B2 | 7/2016 | Fosnight et al. |

(Continued)

FOREIGN PATENT DOCUMENTS

| JP | 2009-173396 A | 8/2009 |
| KR | 10-2021-0106549 A | 8/2021 |

*Primary Examiner* — Glenn F Myers
(74) *Attorney, Agent, or Firm* — Sughrue Mion, PLLC

(57) ABSTRACT

A wafer storage and transport system includes a ceiling surface which includes a first surface and a second surface, a first traveling rail installed on the second surface, a second traveling rail which is spaced apart from the first surface in a third direction, and extends in a first direction, a transport unit which is movable in the first direction along the second traveling rail and transports a FOUP, storage spaces installed on the first surface and which may store the FOUP, an interface port installed on the second surface and which temporarily stores the FOUP, and an OHT which is movable along the first traveling rail, wherein the transport unit grasps the FOUP arranged in the storage spaces and transports the FOUP to the interface port, and the OHT grasps the FOUP temporarily stored in the interface port and transports the FOUP to a semiconductor facility.

20 Claims, 17 Drawing Sheets

(56)        References Cited

U.S. PATENT DOCUMENTS

| | | | |
|---|---|---|---|
| 10,043,699 | B2 | 8/2018 | Li et al. |
| 10,453,724 | B2 | 10/2019 | Yoo et al. |
| 11,239,102 | B2 | 2/2022 | Goto |
| 2016/0329225 | A1* | 11/2016 | Bachlechner ..... H01L 21/67769 |
| 2019/0291752 | A1* | 9/2019 | Takai ........................ B61B 3/02 |
| 2021/0043487 | A1* | 2/2021 | Goto ........................ B65G 1/06 |
| 2021/0138911 | A1* | 5/2021 | Mizutani ........... H01L 21/67733 |
| 2022/0189807 | A1* | 6/2022 | Wada ............... H01L 21/67736 |

* cited by examiner

FIG. 11

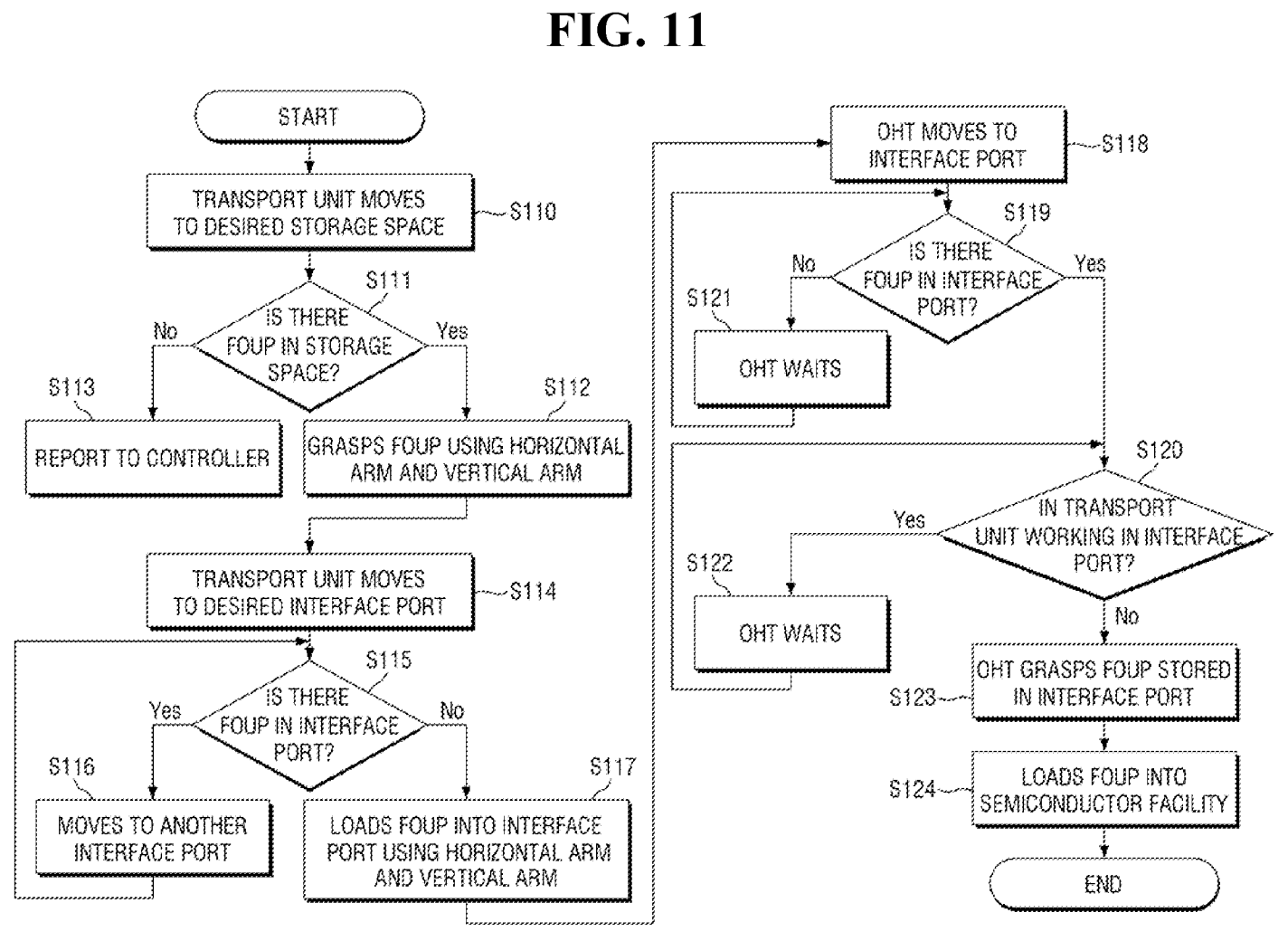

START

S110 — TRANSPORT UNIT MOVES TO DESIRED STORAGE SPACE

S111 — IS THERE FOUP IN STORAGE SPACE?

No → S113 — REPORT TO CONTROLLER

Yes → S112 — GRASPS FOUP USING HORIZONTAL ARM AND VERTICAL ARM

S114 — TRANSPORT UNIT MOVES TO DESIRED INTERFACE PORT

S115 — IS THERE FOUP IN INTERFACE PORT?

Yes → S116 — MOVES TO ANOTHER INTERFACE PORT

No → S117 — LOADS FOUP INTO INTERFACE PORT USING HORIZONTAL ARM AND VERTICAL ARM

S118 — OHT MOVES TO INTERFACE PORT

S119 — IS THERE FOUP IN INTERFACE PORT?

No → S121 — OHT WAITS

Yes → S120 — IN TRANSPORT UNIT WORKING IN INTERFACE PORT?

Yes → S122 — OHT WAITS

No → S123 — OHT GRASPS FOUP STORED IN INTERFACE PORT

S124 — LOADS FOUP INTO SEMICONDUCTOR FACILITY

END

WAFER STORAGE AND TRANSPORT SYSTEM AND METHOD OF OPERATION OF WAFER STORAGE AND TRANSPORT SYSTEM

CROSS-REFERENCE TO RELATED APPLICATION

This application claims priority to Korean Patent Application No. 10-2022-0081383 filed on Jul. 1, 2022 in the Korean Intellectual Property Office, the disclosure of which is incorporated by reference herein in its entirety.

BACKGROUND

1. Field

The present disclosure relates to a wafer storage and transport system and a method of operating the wafer storage and transport system.

2. Description of Related Art

In a semiconductor fabrication (fab), a situation in which a semiconductor facility becomes full during progress of processes, or a situation in which a next stage is not prepared and waiting is required, may frequently occur. In such situations, a space for intermediate temporary storage of wafers is required inside the fab.

A stocker, which is a ground-type storage device, is installed on a bottom surface of the fab and occupies a footprint, like the semiconductor facility. Therefore, there is a limit to the placement of the stocker, which needs to be placed in a remaining region after the initial placement of the semiconductor facility.

Therefore, as a method for solving the footprint problem, research is being conducted on a method of placing the wafer storage device on the ceiling of the fab.

SUMMARY

One or more example embodiments provide a wafer storage and transport system capable of securing a storage quantity of a wafer and reducing the footprint of a semiconductor fab (FAB).

In addition, one or more example embodiments provide a method of operating the wafer storage and transport system capable of securing the storage quantity of the wafer and reducing the footprint of the semiconductor fab.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of an example embodiment, a wafer storage and transport system includes: a ceiling surface including a first surface and a second surface opposite to the first surface; a first traveling rail installed on the second surface; a second traveling rail spaced apart from the first surface in a third direction, and extending in a first direction; a transport unit which is movable in the first direction along the second traveling rail, and configured to transport a Front Opening Unified Pod (FOUP); storage spaces installed on the first surface and configured to store the FOUP such that the FOUP is arranged inside the storage spaces in the first direction and a second direction, and the FOUP is not arranged in the third direction; an interface port installed on the second surface and configured to temporarily store the FOUP; and an Overhead Hoist Transport (OHT) which is movable along the first traveling rail, wherein the transport unit is further configured to grasp the FOUP arranged in the storage spaces and transport the FOUP to the interface port, and the OHT is configured to grasp the FOUP temporarily stored in the interface port and transport the FOUP to a semiconductor facility.

According to an aspect of an example embodiment, a wafer storage and transport system includes: a first ceiling surface which includes a first surface, a second surface opposite to the first surface, and an opening; a second ceiling surface which is spaced apart from the first ceiling surface in a third direction; a transport unit which is provided below the second ceiling surface and is movable in a first direction, the transport unit being configured to transport a Front Opening Unified Pod (FOUP), and the transport unit includes: a pair of horizontal arms extendable in a second direction; and a vertical arm extendable in the third direction; a storage space which is installed on the first surface and configured to store the FOUP such that the FOUP is arranged inside the storage space in the first direction and the second direction, and the FOUP is not arranged in the third direction; an interface port installed on the second surface in a region that overlaps the opening in the third direction, and configured to temporarily store the FOUP such that the FOUP is arranged in a line inside the interface port in the first direction; and an Overhead Hoist Transport (OHT) which is movable along a first traveling rail installed on the second surface, wherein the transport unit is installed in a region that overlaps the interface port in the third direction, the transport unit is further configured to extend the pair of horizontal arms in the second direction, extend the vertical arm in the third direction to grasp the FOUP arranged in the storage space, and transport the grasped FOUP by extending the vertical arm in the third direction to the interface port, the pair of horizontal arms includes a first arm and a second arm, and a distance between the first arm and the second arm in the first direction narrows, as the first arm and the second arm extend away from a main body of the transport unit in the second direction, a diameter of the vertical arm narrows, as the vertical arm extends away from the main body of the transport unit in the third direction, and the OHT is configured to transport the FOUP temporarily stored in the interface port to a semiconductor facility.

According to an aspect of an example embodiment, a method of operating a wafer storage and transport system, includes: moving a transport unit along a second traveling rail in a first direction under control of a controller, wherein the transport unit includes a pair of horizontal arms extendable in a second direction and a vertical arm extendable in a third direction, grasping, by the transport unit, a Front Opening Unified Pod (FOUP) stored in storage spaces and loading the FOUP into an interface port placed between the storage spaces, the FOUP being arranged inside the storage spaces in the first direction and the second direction and not being arranged in the third direction, and the FOUP being arranged in a line inside the interface port in the first direction; moving an Overhead Hoist Transport (OHT) to the interface port along a first traveling rail spaced apart from the second traveling rail in the third direction in response to under control of the controller; and grasping, by the OHT, the FOUP temporarily stored in the interface port and transporting the FOUP to a semiconductor facility, wherein the grasping, by the transport unit, the FOUP stored in the storage spaces includes extending the pair of horizontal arms in the second direction and extending the vertical arm in the third direction, and the loading, by the transport unit, the FOUP into the interface port includes extending the vertical arm in the third direction.

BRIEF DESCRIPTION OF THE DRAWINGS

The above and other aspects and features of the present disclosure will become more apparent by describing in detail example embodiments thereof with reference to the attached drawings, in which:

FIG. 11 is a flow chart for explaining a method of operating the wafer storage and transport system according to some example embodiments.

DETAILED DESCRIPTION

A wafer storage and transport system according to some example embodiments will be described below with reference to FIGS. 1, 2, 3, 4, 5, 6, 7, 9 and 10.

Hereinafter, example embodiments are described in conjunction with the accompanying drawings. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
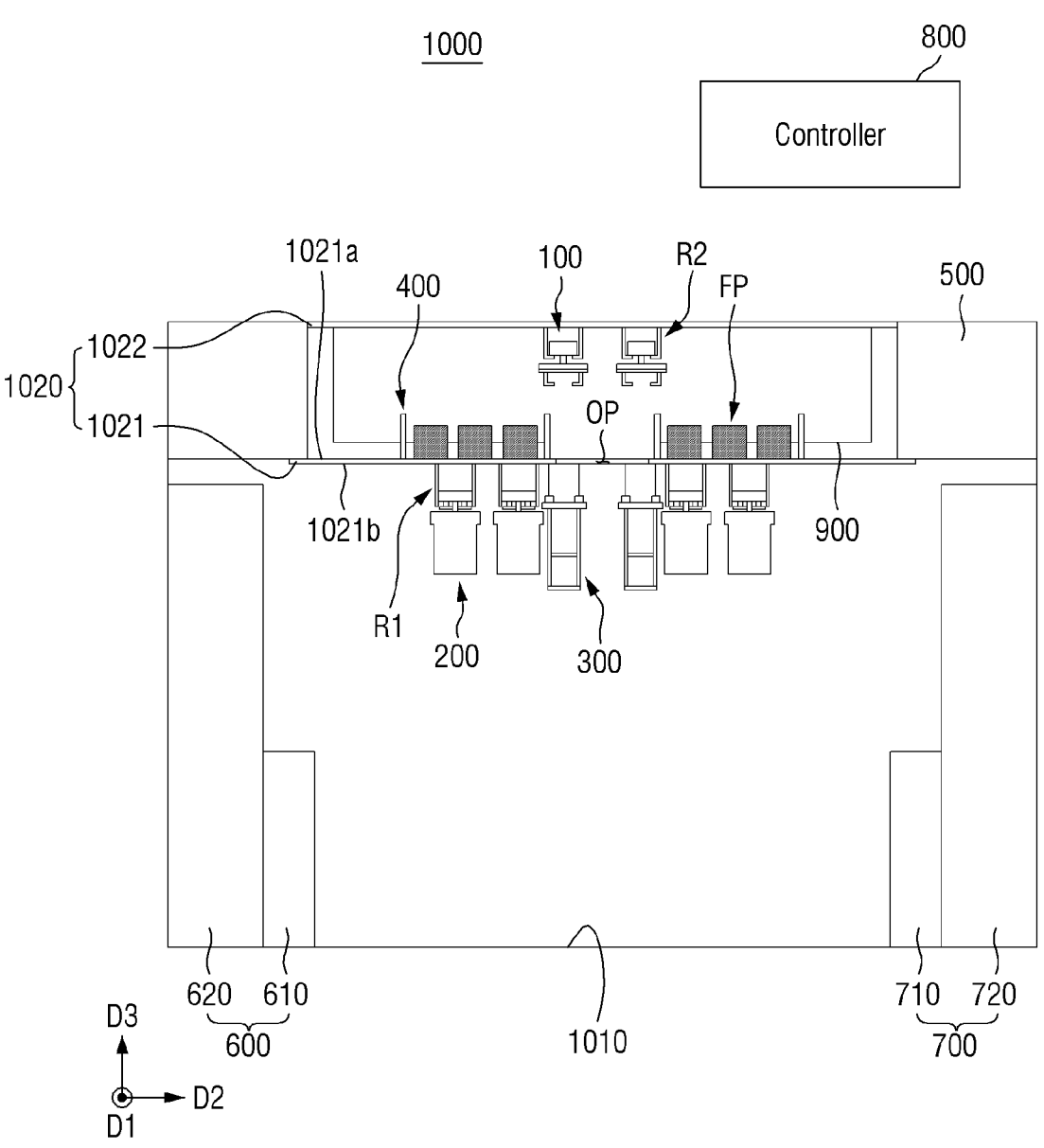
FIG. 1 is an example diagram for describing a wafer storage and transport system according to some example embodiments.

FIG. 1 is an example diagram for describing a wafer storage and transport system according to some example embodiments.

First, referring to FIG. 1, a wafer storage and transport system 1000 may include a transport unit 100, an OHT 200, an interface port 300, a storage space 400, a wall 500, a Front Opening Unified Pod (FOUP) stocker 600, semiconductor facility 700, and a piping 900.

The wafer storage and transport system 1000 may include a bottom surface 1010 and a ceiling surface 1020. The bottom surface 1010 may be a bottom surface of the semiconductor fab. The FOUP stocker 600 and the semiconductor facility 700 may be placed on the bottom surface 1010. Also, a wafer storage device capable of storing wafers may be placed on the bottom surface 1010. With the wafer storage and transport system 1000 according to some example embodiments, it is possible to reduce the number of wafer storage devices placed on the bottom surface 1010 of the semiconductor fab. Therefore, the footprint of the semiconductor fab (FAB) may be improved.

The FOUP stocker 600 may be a space that stores a FOUP (Front Opening Unified Pod) (FP). A plurality of wafers may be stored in the FOUP (FP). The plurality of wafers may be stored in the FOUP (FP) and provided to the semiconductor facility 700. In some example embodiments, the FOUP stocker 600 may include a front device 610 and a main device 620. The front device 610 may be installed on one side of the main device 620. The front device 610 may be placed on the bottom surface 1010 of the semiconductor fab (FAB). The OHT 200 may load the FOUP (FP) into the front device 610. The FOUP (FP) loaded into the front device 610 may be moved to the main device 620 and stored therein.

The semiconductor facility 700 may be facility in which various semiconductor processes are performed. For example, a deposition process, a cleaning process, an etching process, a photo process, and the like may be performed in the semiconductor facility 700. In some example embodiments, the semiconductor facility 700 may include a front module 710 and a main module 720. The front module 710 may be installed on one side of the main module 720. The OHT 200 may load the FOUP (FP) into the front module 710. The FOUP (FP) loaded into the front module 710 may be moved to the main module 720, and various semiconductor processes may be performed in the main module 720.

A plurality of FOUPs stockers 600 and a plurality of semiconductor facilities 700 are placed on the bottom surface 1010 of the semiconductor fab (FAB). The semiconductor fab (FAB) has a limited area. Because the plurality of FOUPs stockers 600 and the plurality of semiconductor facilities 700 need to be placed on the limited bottom surface 1010 of the semiconductor fab (FAB), the space for storing the FOUP (FP) or the wafer is insufficient. When using the wafer storage and transport system 1000 according to some example embodiments, the wafer may be stored on the ceiling surface 1020. Therefore, the footprint of the semiconductor fab (FAB) can be improved. Details of the space and manner in which wafers may be stored on the ceiling surface 1020 will be provided below.

The ceiling surface 1020 may be placed on the bottom surface 1010. The ceiling surface 1020 may be spaced apart from the bottom surface 1010 in a third direction D3. The ceiling surface 1020 may be connected to the wall 500. In some example embodiments, the ceiling surface 1020 may include a first ceiling surface 1021 and a second ceiling surface 1022. A second ceiling surface 1022 may be placed on the first ceiling surface 1021. The first ceiling surface 1021 and the second ceiling surface 1022 may be spaced apart from each other. For example, the first ceiling surface 1021 and the second ceiling surface 1022 may be spaced from each other in the third direction D3. The first ceiling surface 1021 may be connected to one side of the wall 500, and the second ceiling surface 1022 may be connected to the other side of the wall 500. Herein, a first direction D1, a second direction D2 and the third direction D3 may be substantially perpendicular to each other.

In some example embodiments, the first ceiling surface 1021 may include a first surface 1021*a* and a second surface 1022*b*. The first surface 1021*a* and the second surface 1022*b* may be opposite to each other. For example, the first surface 1021*a* may face the second ceiling surface 1022. The second surface 1021*b* may face the bottom surface 1010.

The storage space 400 may be placed on the first surface 1021*a* of the first ceiling surface 1021. The FOUP (FP) may be stored inside the storage space 400. The FOUP (FP) may be arranged in the first direction D1 and the second direction D2. The FOUP (FP) may not be stacked in the third direction D3. In some example embodiments, the first ceiling surface 1021 may include an opening OP. The opening OP may be placed in the central region of the first ceiling surface 1021, but is not limited thereto. The FOUP (FP) may be loaded into the interface port 300 through the opening OP. A vertical arm (170 of FIG. 3) of the transport unit 100 may extend in the third direction D3 through the opening OP. The storage space 400 may be placed on one side and the other side of the opening OP. As an example embodiment, although one storage space 400 may each be placed on one side and the other side of the opening OP, the present disclosure is not limited thereto.

A first traveling rail R1 may be installed on the second surface 1021*b* of the first ceiling surface 1021. The first traveling rail R1 may be a rail along which the OHT 200 moves. That is, the OHT 200 may move to a desired position along the first traveling rail R1. As an example embodiment, the OHT 200 may move to a position adjacent to the interface port 300 along the first traveling rail R1. As another example embodiment, the OHT 200 may move to a position adjacent to the FOUP stocker 600 along first traveling rail R1. The OHT 200 may move to a position adjacent to the FOUP stocker 600 and load the FOUP (FP) into the FOUP stocker 600. As yet another example embodiment, the OHT 200 may move to a position adjacent to the semiconductor facility 700 along the first traveling rail R1. The OHT 200 may move to a position adjacent to the semiconductor facility 700 and load the FOUP (FP) into the semiconductor facility 700. The first traveling rail R1 may include a plurality of sub-rails extending in the first direction D1 and the second direction D2.

The interface port 300 may be placed on the second surface 1021*b* of the first ceiling surface 1021. That is, the interface port 300 may be placed below the first ceiling surface 1021. The interface port 300 may overlap the opening OP of the first ceiling surface 1021 in the third direction D3. The interface port 300 may be a space in which the FOUP (FP) temporarily stays. The FOUP (FP) may be temporarily stored in the interface port 300 and may move to another position through the OHT 200.

A second traveling rail R2 may be placed below the second ceiling surface 1022. The second traveling rail R2 may be a rail along which the transport unit 100 moves. According to an example embodiment, the second traveling rail R2 may extend only in the first direction D1. The second traveling rail R2 does not extend in the second direction D2. That is, the transport unit 100 may be movable only in the first direction D1 and the transport unit 100 does not move in the second direction D2. In some example embodiments, the second traveling rail R2 may be installed at a position at which it overlaps the interface port 300 in the third direction D3. The transport unit 100 may load the FOUP (FP) into the interface port 300 after moving to the upper part of the interface port 300 along the second traveling rail R2.

The piping 900 may be connected to each of a plurality of FOUPs (FP). The piping 900 may supply nitrogen ($N_2$) to the interior of the FOUP (FP). Because nitrogen ($N_2$) is supplied to each of the plurality of FOUPs (FP), the FOUPs (FP) may be stored for a long period of time. Unlike the shown example embodiment, the piping 900 may extend along the first surface 1021*a* of the first ceiling surface 1021, but is not limited thereto. It is needless to say that the position, arrangement, placement and the like of the piping 900 may be changed as much as possible, depending on the design.

The wafer storage and transport system 1000 according to some example embodiments may further include a controller 800.

The controller 800 may generally control the wafer storage and transport system 1000. For example, the controller 800 may control movement of the transport unit 100 and operation of the transport unit 100. Also, the controller 800 may control the movement of the OHT 200 and the operation of the OHT 200.

Additionally, the controller 800 may store and manage information of the FOUP (FP) or the wafers stored in the wafer storage and transport system 1000. For example, the controller 800 may store information about the number, position and the like of FOUPs (FP) stored in the storage space 400. The controller 800 may store information about the number and positions of FOUPs (FP) temporarily stored in the interface port 300.

Additionally, each FOUP (FP) may have a unique Radio-frequency identification (RFID). The RFID may include information about each FOUP (FP). The RFIDs may be reported to the controller 800 by a calculation.

Each example configuration described in FIG. 1 will be described in more detail below with reference to FIGS. 2, 3, 4, 5, 6, 7 and 8.

Figure 2:
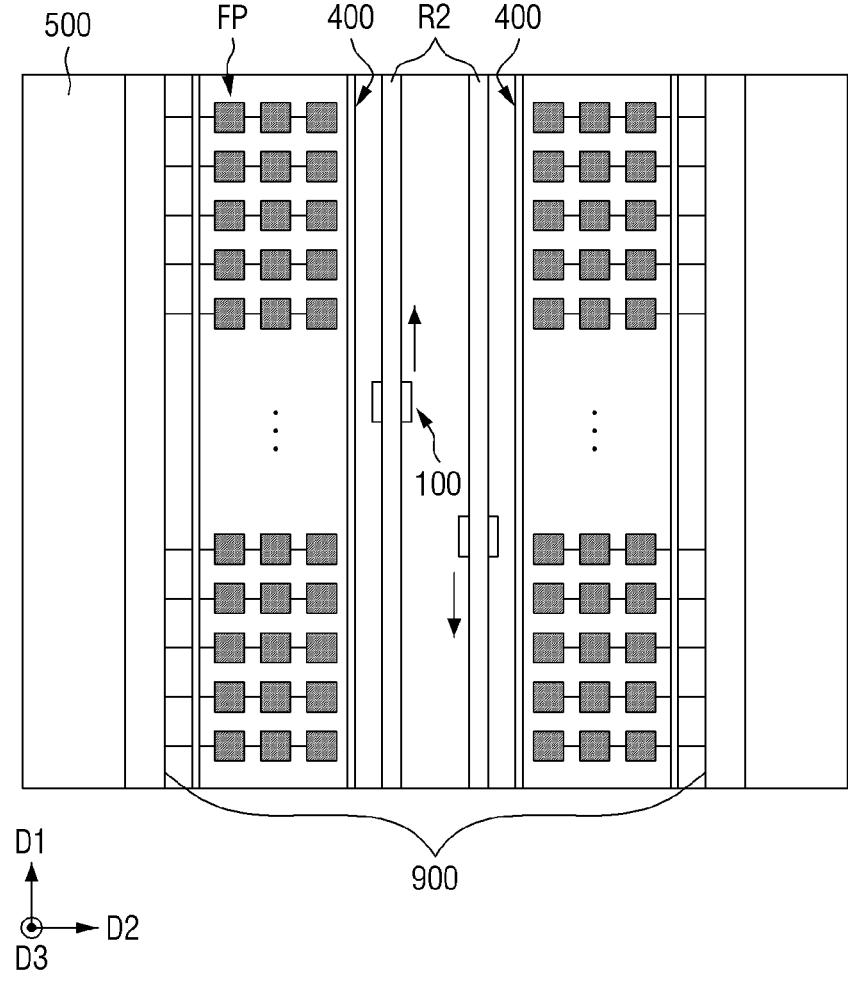
FIG. 2 is an example plan view for explaining the storage space and the transport unit according to an example embodiment.

FIG. 2 is an example plan view for explaining the storage space 400 and the transport unit 100 according to an example embodiment.

Referring to the example embodiment shown in FIG. 2, the second traveling rail R2 extends long in the first direction D1. The second traveling rail R2 does not include a portion extending in the second direction D2. The second traveling rail R2 may extend straight. The transport unit 100 may be movable only in the first direction D1 along the second traveling rail R2.

In some example embodiments, two second traveling rails R2 may be installed. Each second traveling rail R2 may be installed on one side of each storage space 400. The second traveling rail R2 may not overlap the storage space 400 in the third direction D3. That is, the transport unit 100 may travel at a position where it does not overlap the storage space 400 in the third direction D3. However, the present disclosure is not limited thereto. According to various example embodiments, the number and placement of the second traveling rails R2 may vary as much as possible, according to the design of the wafer storage and transport system 1000.

In some example embodiments, two storage spaces 400 may be installed. The storage spaces 400 may be placed on both sides on the basis of the second traveling rail R2. However, the present disclosure is not limited thereto. According to various example embodiments, the number and placement of storage spaces 400 may vary as much as possible, depending on the design of wafer storage and transport system 1000.

In some example embodiments, the FOUP (FP) may be arranged inside the storage space 400. The FOUP (FP) may be arranged inside the storage space 400 in the first direction D1 and the second direction D2. The FOUP (FP) may not be arranged inside the storage space 400 in the third direction D3. That is, the FOUPs (FP) are not stacked in the third direction D3. The FOUP (FP) may be arranged two-dimensionally inside a plane in which the first direction D1 and the second direction D2 extend.

The storage space 400 may be formed at a distance which is partially spaced apart from the wall 500. A worker may perform various tasks in the space between the storage space 400 and the wall 500. For example, according to an example embodiment, the worker may generally manage the wafer storage and transport system 1000 in the space, but is not limited thereto.

In some example embodiments, the number of FOUPs (FP) arranged inside the storage space 400 in the second direction D2 may be three to six. As an example, the number of FOUP (FP) arranged inside the storage space 400 in the second direction D2 may be three. The number of FOUPS (FP) arranged inside the storage space 400 in the second direction D2 may vary, depending on the maximum distance at which the horizontal arm (130 of FIG. 3) of the transport unit 100 may slide in the second direction D2.

The piping 900 may be connected to each of the plurality of FOUPs (FP). Nitrogen (N$_2$) may be supplied to each of the plurality of FOUPs (FP) through the piping 900.

Figure 3:
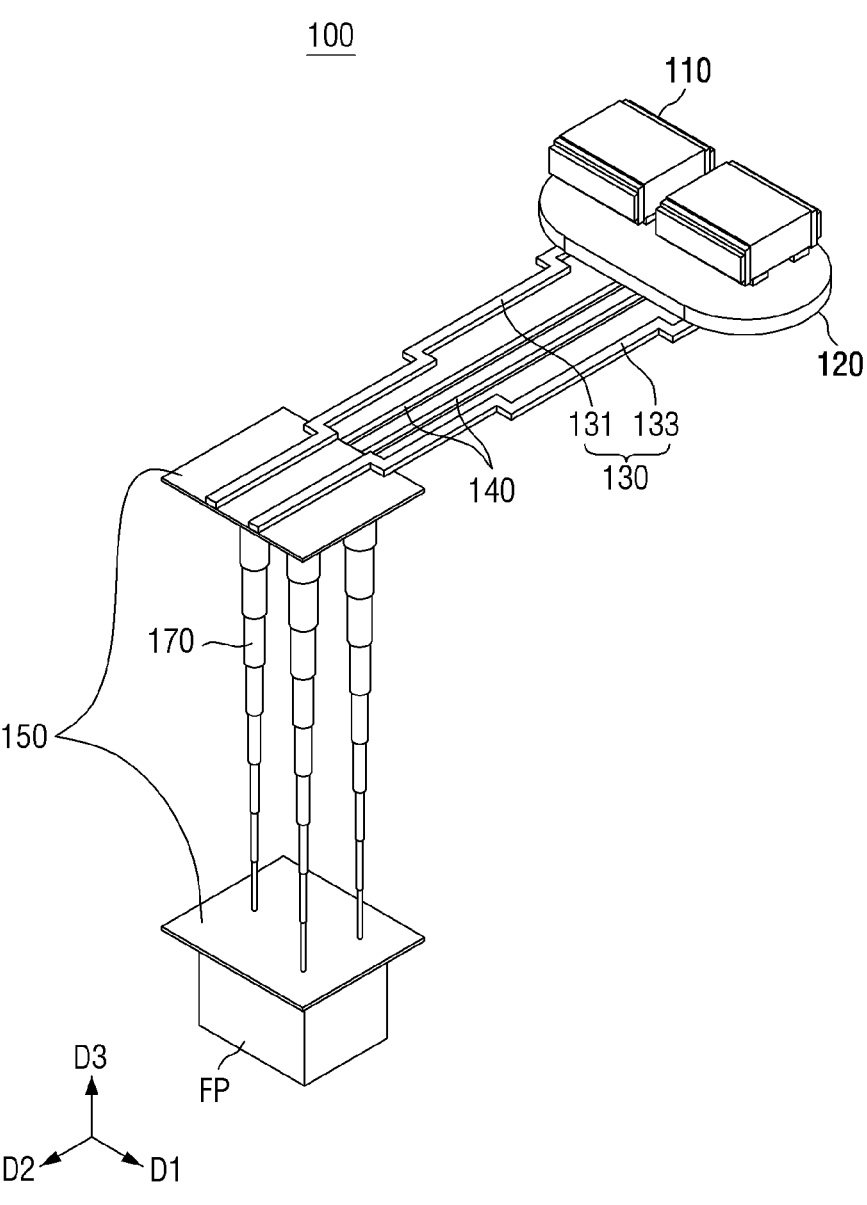
FIG. 3 is an example perspective view for explaining the transport unit according to an example embodiment.
Figure 4:
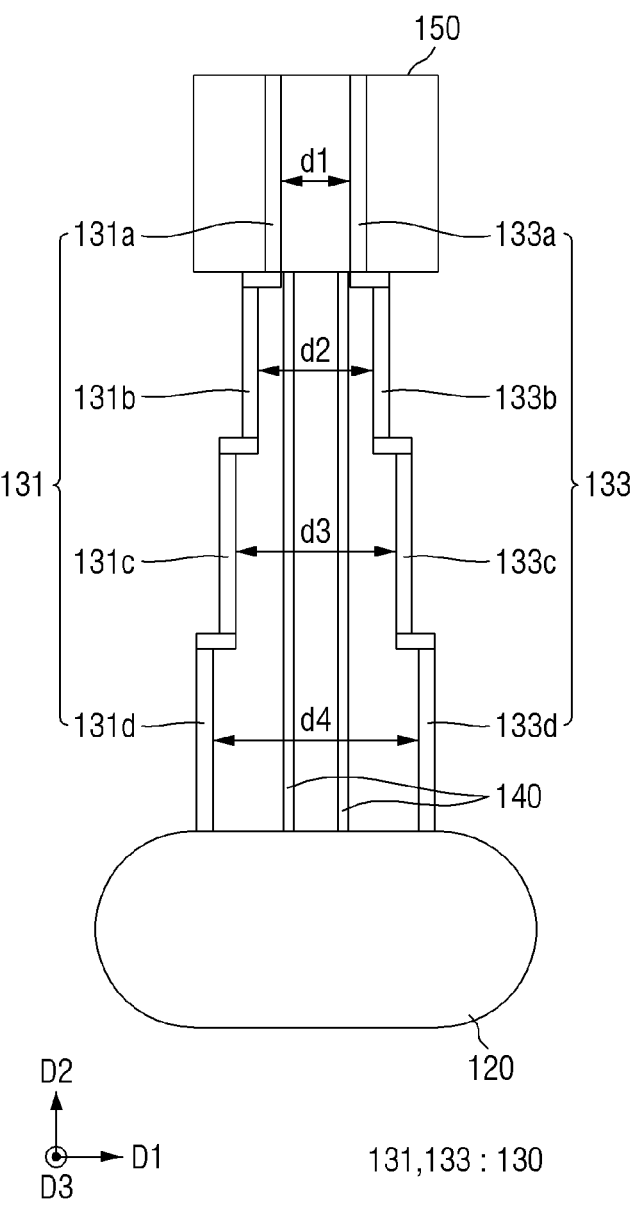
FIG. 4 is an example plan view for explaining the transport unit according to an example embodiment.
Figure 5:
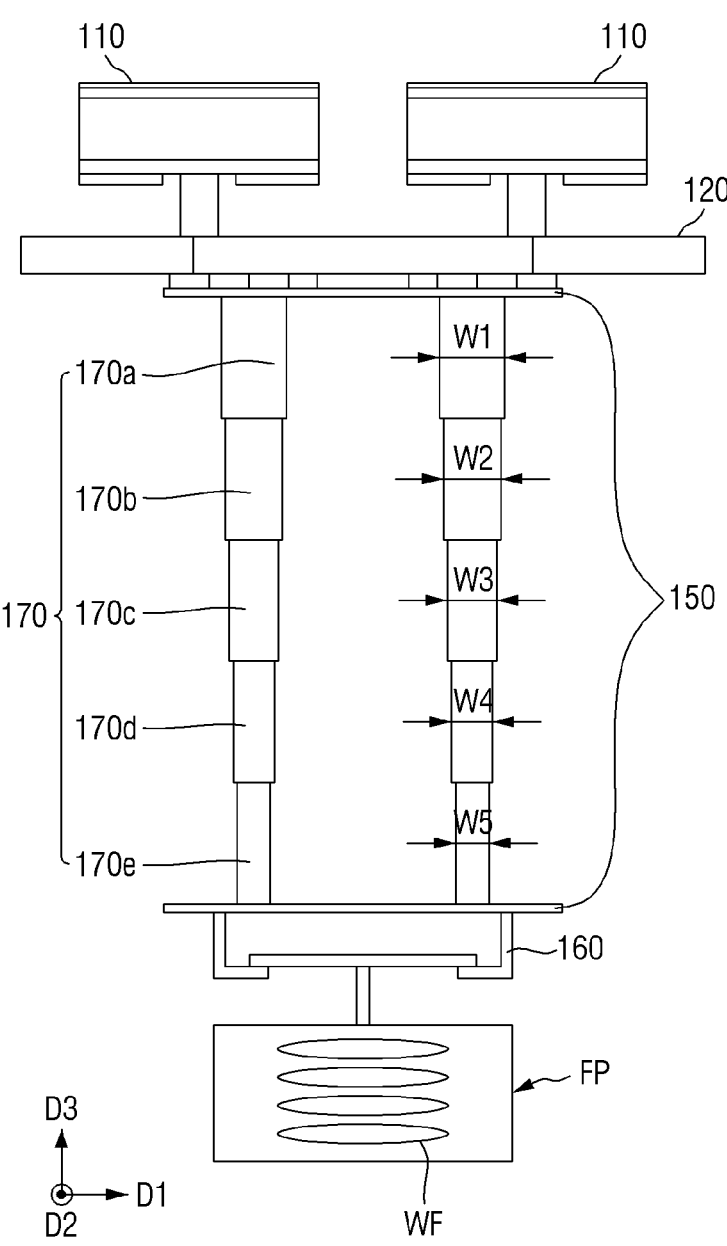
FIG. 5 is an example cross-sectional view for explaining the transport unit according to an example embodiment.

FIG. 3 is an example perspective view for explaining the transport unit 100 according to an example embodiment. FIG. 4 is an example plan view for explaining the transport unit 100 according to an example embodiment. FIG. 5 is an example cross-sectional view for explaining the transport unit 100 according to an example embodiment. The transport unit 100 according to some example embodiments will be described in detail referring to FIGS. 3, 4 and 5.

Referring to example embodiments shown in FIGS. 3, 4 and 5, the transport unit 100 may include a rail connecting part 110, a main body 120, a horizontal arm 130, a sub-arm 140, a plate 150, a hand 160, and a vertical arm 170.

The rail connecting part 110 may be connected to the main body 120. The rail connecting part 110 may be connected to the upper part of the main body 120. The rail connecting part 110 may be fastened to the second traveling rail (R2 of FIG. 1). The transport unit 100 may travel along the second traveling rail R2, using the rail connecting part 110.

The horizontal arm 130 may be connected to the side part of the main body 120. The horizontal arm 130 may be connected to the plate 150. The horizontal arm 130 may be extendable in the second direction D2. One side of the horizontal arm 130 may be connected to the main body 120, and the other side of the horizontal arm 130 may be connected to the plate 150.

The sub-arm 140 may be connected to the side part of the main body 120. The sub-arm 140 may be connected to the plate 150. The sub-arm 140 may be placed between the pair of horizontal arms 130. One side of the sub-arm 140 may be connected to the main body 120, and the other side of the sub-arm 140 may be connected to the plate 150. The sub-arm

140 may be extendable in the second direction D2. The sub-arm 140 may have elasticity. The sub-arm 140 may serve to help the plate 150 be stably supported.

The horizontal arms 130 may be installed in pairs. For example, in FIG. 4, the horizontal arm 130 may include a first arm 131 and a second arm 133. The first arm 131 and the second arm 133 may be spaced apart from each other in the first direction D1.

In some example embodiments, the first arm 131 may include a first portion 131*a*, a second portion 131*b*, a third portion 131*c*, and a fourth portion 131*d*. The first portion 131*a* of the first arm 131 may be connected to the plate 150. The second portion 131*b* of the first arm 131 may be connected to the first portion 131*a* of the first arm 131 and the third portion 131*c* of the first arm 131. The third portion 131*c* of the first arm 131 may be connected to the second portion 131*b* of the first arm 131 and the fourth portion 131*d* of the first arm 131. The fourth portion 131*d* of the first arm 131 may be connected to the third portion 131*c* of the first arm 131. Also, the fourth portion 131*d* of the first arm 131 may be connected to the main body 120. According to an example embodiment, if the first arm 131 includes a fifth portion, the fifth portion of the first arm 131 may be connected to the fourth portion 131*d* of the first arm 131.

The second arm 133 may include a first portion 133*a*, a second portion 133*b*, a third portion 133*c*, and a fourth portion 133*d*. The first portion 133*a* of the second arm 133 may be connected to the plate 150 and the second portion 133*b* of the second arm 133. The second portion 133*b* of the second arm 133 may be connected to the first portion 133*a* of the second arm 133 and the third portion 133*c* of the second arm 133. The third portion 133*c* of the second arm 133 may be connected to the second portion 133*b* of the second arm 133 and the fourth portion 133*d* of the second arm 133. The fourth portion 133*d* of the second arm 133 may be connected to the third portion 133*c* of the second arm 133. Also, the fourth portion 133*d* of the second arm 133 may be connected to the main body 120. According to an example embodiment, if the second arm 133 includes a fifth portion, the fifth portion of the second arm 133 may be connected to the fourth portion 133*d* of the second arm 133.

In some example embodiments, a spaced distance in the first direction D1 between the first arm 131 and the second arm 133 may decrease, as the first arm 131 and the second arm 133 extend away from the main body 120 in the second direction D2. For example, according to an example embodiment, the first portion 131*a* of the first arm 131 and the first portion 133*a* of the second arm 133 may be spaced apart from each other by a first distance d1 in the first direction D1. The second portion 131*b* of the first arm 131 and the second portion 133*b* of the second arm 133 may be spaced apart from each other by a second distance d2 in the first direction D1. The third portion 131*c* of the first arm 131 and the third portion 133*c* of the second arm 133 may be spaced apart from each other by a third distance d3 in the first direction D1. The fourth portion 131*d* of the first arm 131 and the fourth portion 133*d* of the second arm 133 may be spaced apart from each other by a fourth distance d4 in the first direction D1.

The first distance d1 may be smaller than the second distance d2. The second distance d2 may be smaller than the third distance d3. The third distance d3 may be smaller than the fourth distance d4. By having a structure in which the spaced distance between the first arm 131 and the second arm 133 decreases as the pair of horizontal arms 130 go away from the main body in the second direction D2, the plate 150 may move more stably.

A sub-arm 140 may be installed between the pair of horizontal arms 130. The sub-arm 140 may be extendable in the second direction D2 between the plate 150 and the main body 120. The sub-arm 140 may have elasticity. Therefore, even if the plate 150 moves away from the main body 120 in the second direction D2, the plate 150 can be stably fixed.

Referring to FIG. 3 again, the plate 150 may be movable in the third direction D3. The vertical arm 170 may be connected to the plate 150, and may move the plate 150 in the third direction D3. A part of the plate 150 may be connected to the horizontal arm 130 and the sub-arm 140, and another part of the plate 150 may be connected to the hand 160. The hand 160 may hold the FOUP (FP).

Referring to the example embodiment shown in FIG. 5, the hand 160 may be connected to the plate 150. The FOUP (FP) may be grasped using the hand 160. According to an example embodiment, before the pair of hands 160 grasp the FOUP (FP), each of the pair of hands 160 may spread in the first direction D1. The pair of hands 160 may grasp the FOUP (FP) and the pair of hands 160 may narrow together in the first direction D1. According to the operation method described above, the hand 160 may grasp the FOUP (FP).

The transport unit 100 may grasp the FOUP (FP) using the hand 160, and transport the FOUP (FP), using the horizontal arm 130 and the vertical arm 170. A plurality of wafers WF may be stored inside the FOUP (FP).

In some example embodiments, the plate 150 and the vertical arm 170 may be connected to each other. The vertical arm 170 may move the plate 150 in the third direction D3. The vertical arm 170 may have a telescopic shape. The telescopic shape may be a shape that changes in diameter as a length increases.

For example, the vertical arm 170 may include a first portion 170a, a second portion 170b, a third portion 170c, a fourth portion 170d, and a fifth portion 170e. The first through fifth portions 170a, 170b, 170c, 170d and 170e of the vertical arm 170 may be provided sequentially. In an example, the first portion 170a of the vertical arm 170 may be connected to the second portion 170b of the vertical arm 170. The second portion 170b of the vertical arm 170 may be connected to the first portion 170a of the vertical arm 170 and the third portion 170c of the vertical arm 170. The third portion 170c of the vertical arm 170 may be connected to the second portion 170b of the vertical arm 170 and the fourth portion 170d of the vertical arm 170. The fourth portion 170d of the vertical arm 170 may be connected to the third portion 170c of the vertical arm 170 and the fifth portion 170e of the vertical arm 170.

In some example embodiments, the diameter of the vertical arm 170 may narrow, as the vertical arm 170 extends away from the main body 120 in the third direction D3. For example, the first portion 170a of the vertical arm 170 has a first width W1 in the first direction D1. The second portion 170b of the vertical arm 170 has a second width W2 in the first direction D1. The third portion 170c of the vertical arm 170 has a third width W3 in the first direction D1. The fourth portion 170d of the vertical arm 170 has a fourth width W4 in the first direction D1. The fifth portion 170e of the vertical arm 170 has a fifth width W5 in the first direction D1. The first through fifth widths W1, W2, W3, W4 and W5 may be diameters of the vertical arm 170.

The first width W1 may be greater than the second width W2. The second width W2 may be greater than the third width W3. The third width W3 may be greater than the fourth width W4. The fourth width W4 may be greater than the fifth width W5. That is, the first portion 170a of the vertical arm 170 closest to the main body 120 has the largest first width W1, and the fifth portion 170e of the vertical arm 170 farthest from the main body 120 has the smallest fifth width W5.

As the vertical arm 170 has a telescopic shape, the plate 150 can be fixed more stably.

Figure 6:
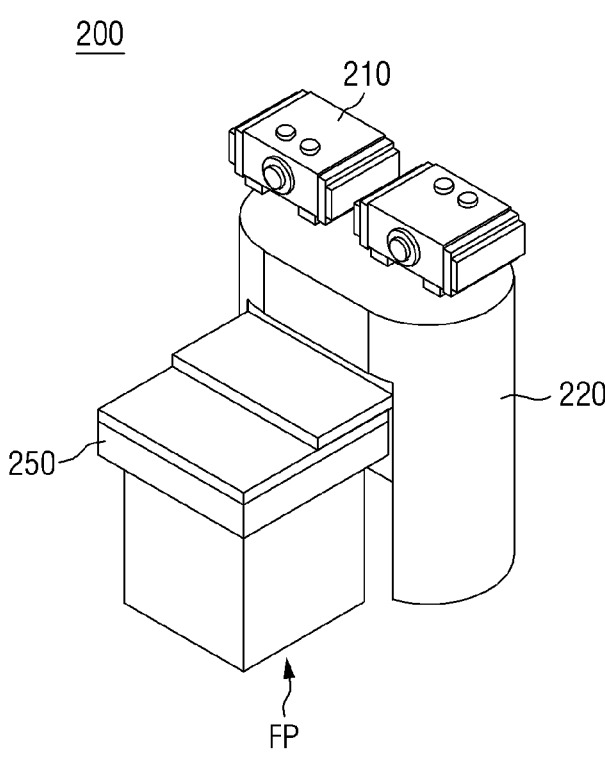
FIG. 6 is an example perspective view for explaining an Overhead Hoist Transport (OHT) according to an example embodiment.
Figure 7:
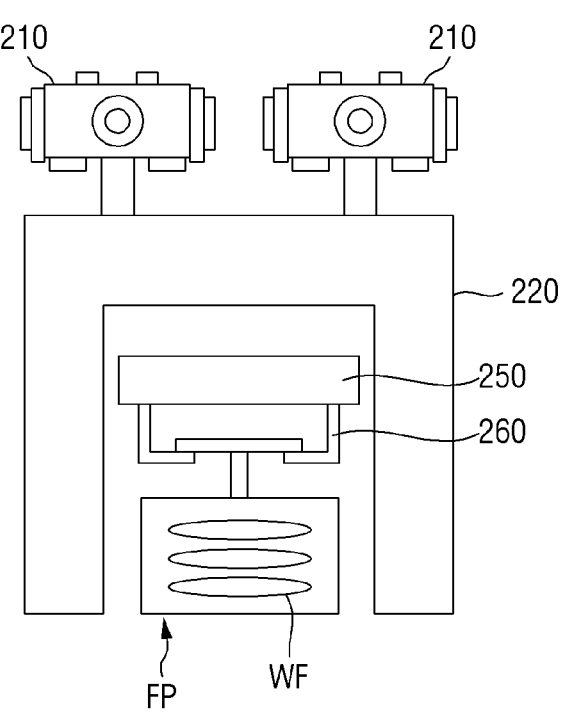
FIG. 7 is an example cross-sectional view for explaining the OHT according to an example embodiment.

FIG. 6 is an example perspective view for explaining an OHT according to an example embodiment. FIG. 7 is an example cross-sectional view for explaining the OHT according to an example embodiment. The OHT according to some example embodiments will be described in detail with reference to FIGS. 6 and 7.

Referring to example embodiments shown in FIGS. 6 and 7, the OHT 200 may include an OHT rail connecting part 210, an OHT main body 220, an OHT plate 250, and an OHT hand 260.

The OHT rail connecting part 210 may be connected to the OHT main body 220. The OHT rail connecting part 210 may be connected to the upper part of the OHT main body 220. The OHT rail connecting part 210 may be fastened to the first traveling rail (R1 of FIG. 1). The OHT 200 may travel along first traveling rail R1, using the OHT rail connecting part 210.

The OHT plate 250 may be placed inside the OHT main body 220. The OHT hand 260 may be installed under the OHT plate 250. The OHT hand 260 may grasp the FOUP (FP). A plurality of wafers WF may be stored inside the FOUP (FP).

According to an example embodiment, the OHT plate 250 may slide horizontally and may move vertically. The OHT plate 250 may move horizontally and vertically, and the OHT hand 260 may grasp the FOUP (FP). The OHT 200 may transport the FOUP (FP) through the example embodiments described above.

Figure 8:
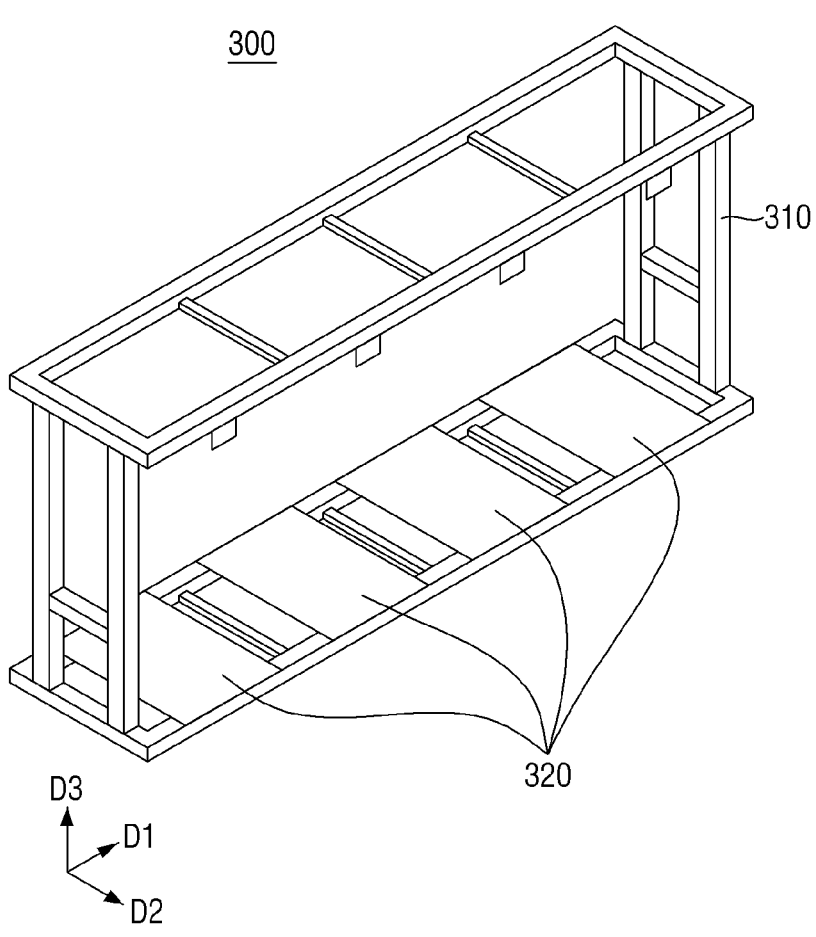
FIG. 8 is an example perspective view for explaining an interface port according to an example embodiment.

FIG. 8 is an example perspective view for explaining an interface port according to an example embodiment.

Referring to FIG. 8, the interface port 300 extends in the first direction D1. The interface port 300 may include a frame 310 and a FOUP seating part 320. The frame 310 may be attached to the first ceiling surface 1021 and may fix the first ceiling surface 1021 and the interface port 300. The FOUP (FP) may be seated on the FOUP seating part 320. The FOUP (FP) may be seated on the FOUP seating part 320, and the FOUP (FP) may be temporarily stored in the interface port 300.

In some example embodiments, the FOUP seating part 320 may be arranged in the first direction D1. The FOUP seating part 320 may not be arranged in the second direction D2. That is, inside the interface port 300, the FOUP (FP) may be arranged only in the first direction D1 and not arranged in the second direction D2. The FOUP (FP) may not be stacked in the third direction D3 inside the interface port 300. The FOUP (FP) may be arranged in a line inside the interface port 300 in the first direction D1. However, the present disclosure is not limited thereto.

Figure 9:
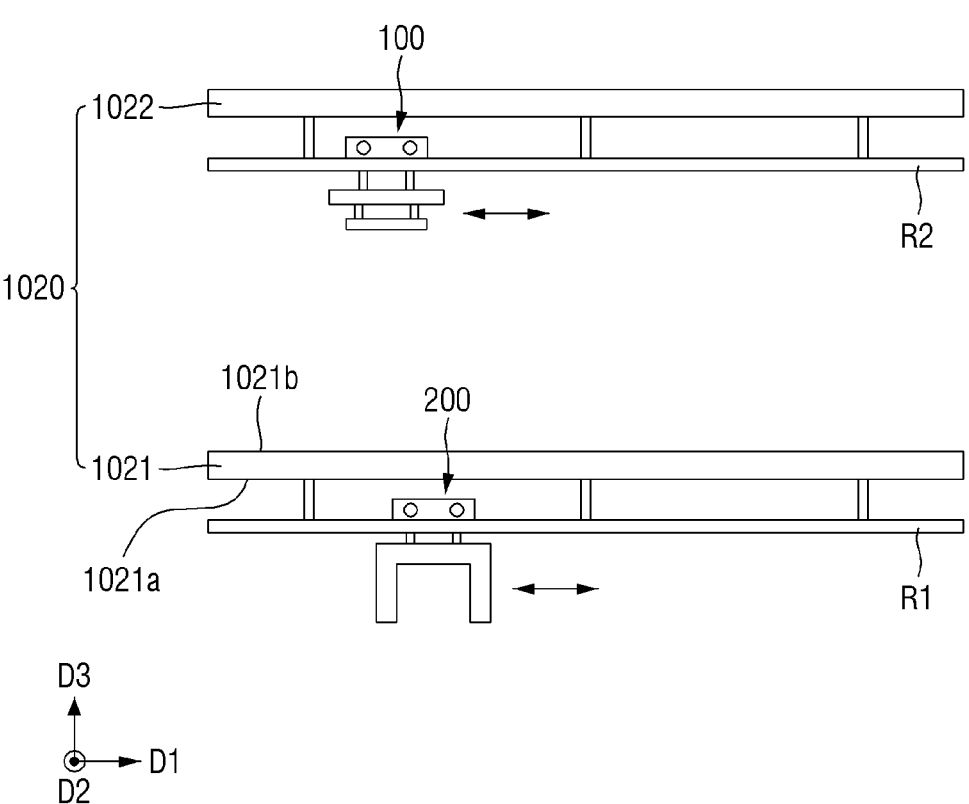
FIG. 9 is an example diagram for explaining the operation of the transport unit and the OHT according to an example embodiment.

FIG. 9 is an example diagram for explaining the operation of the transport unit 100 and the OHT 200 according to an example embodiment.

Referring to the example embodiment shown in FIG. 9, the ceiling surface 1020 includes a first ceiling surface 1021 and a second ceiling surface 1022. The first ceiling surface 1021 includes a first surface 1021a and a second surface 1021b.

The first traveling rail R1 may be provided under the first ceiling surface 1021. The first traveling rail R1 may be installed on the first surface 1021a of the first ceiling surface 1021. The OHT 200 may move along the first traveling rail R1. Although FIG. 9 only shows that the first traveling rail R1 extends in the first direction D1, according to an example embodiment the first traveling rail R1 may extend in the second direction D2. Also, according to an example embodiment the first traveling rail R1 may be provided in a curved shape instead of a straight line.

The second traveling rail R2 may be provided under the second ceiling surface 1022. The transport unit 100 moves along the second traveling rail R2. The second traveling rail R2 may extend in the first direction D1. The second traveling rail R2 may be formed straight. Therefore, the transport unit 100 may also be movable only in the first direction D1.

Figure 10:
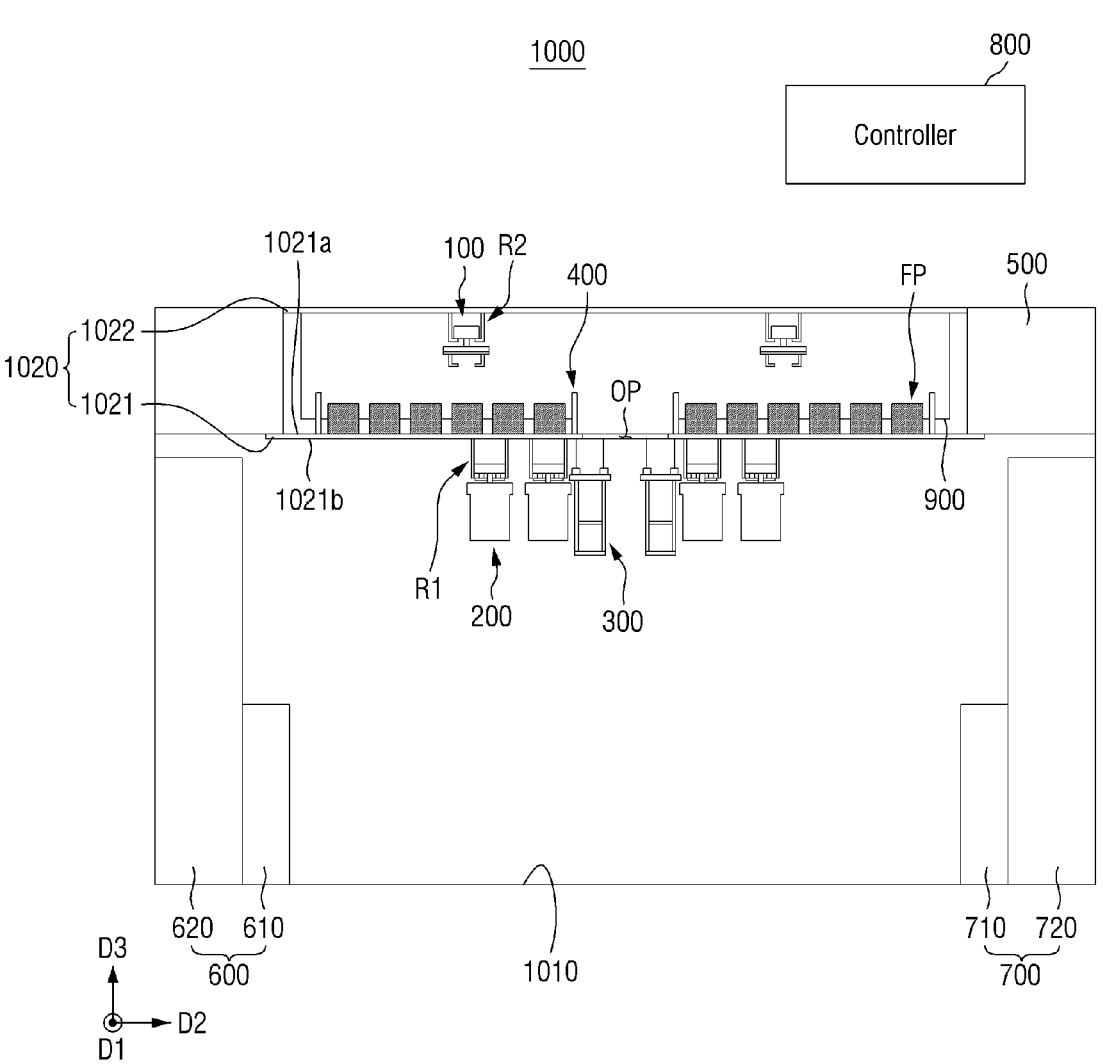
FIG. 10 is an example diagram for explaining a wafer storage and transport system according to another example embodiment.

FIG. 10 is an example diagram for explaining a wafer storage and transport system according to another example embodiment. For convenience of explanation, the explanation will be provided mainly on points that are different from those explained using FIGS. 1, 2, 3, 4, 5, 6, 7, 8 and 9.

Referring to FIG. 10, the second traveling rail R2 may be installed on the storage space 400. The second traveling rail R2 may overlap the storage space 400 in the third direction D3. The second traveling rail R2 may not overlap the interface port 300 in the third direction D3.

In some example embodiments, the number of FOUPs (FP) arranged in the storage space in the second direction D2 may be three to six. As an example, according to an example embodiment the number of FOUPs (FP) arranged in the storage space 400 in the second direction D2 may be six. In this case, the horizontal arm (130 of FIG. 3) may be used, even when the transport unit 100 loads the FOUP (FP) into the interface port 300.

More specifically, when the transport unit 100 grasps the FOUP (FP) stored in the storage space 400, both the horizontal arm (130 of FIG. 3) and the vertical arm (170 of FIG. 3) may be used. Also, even when the transport unit 100 seats the FOUP (FP) on the interface port 300, both the horizontal arm (130 of FIG. 3) and the vertical arm (170 of FIG. 3) may be used.

The wafer storage and transport system according to some example embodiments will described below with reference to FIGS. 11, 12, 13, 14, 15, 16 and 17.

FIG. 11 is a flow chart for explaining a method of operating the wafer storage and transport system according to some example embodiments. FIGS. 12, 13, 14, 15, 16 and 17 are diagrams for explaining the method of operating the wafer storage and transport system according to some example embodiments.

First, referring to FIGS. 1 and 11, the transport unit 100 may be moved to a desired storage space 400 (S110). At this time, the transport unit 100 may move in the first direction D1 and be positioned on one side of the storage space 400.

Next, it may be checked whether there is an FOUP (FP) in the storage space 400 (S111). If there is no FOUP (FP) in the storage space 400, this may be reported to the controller 800. If there is no FOUP (FP) in the storage space 400, the transport unit 100 may move to another storage space 400.

Figure 12:
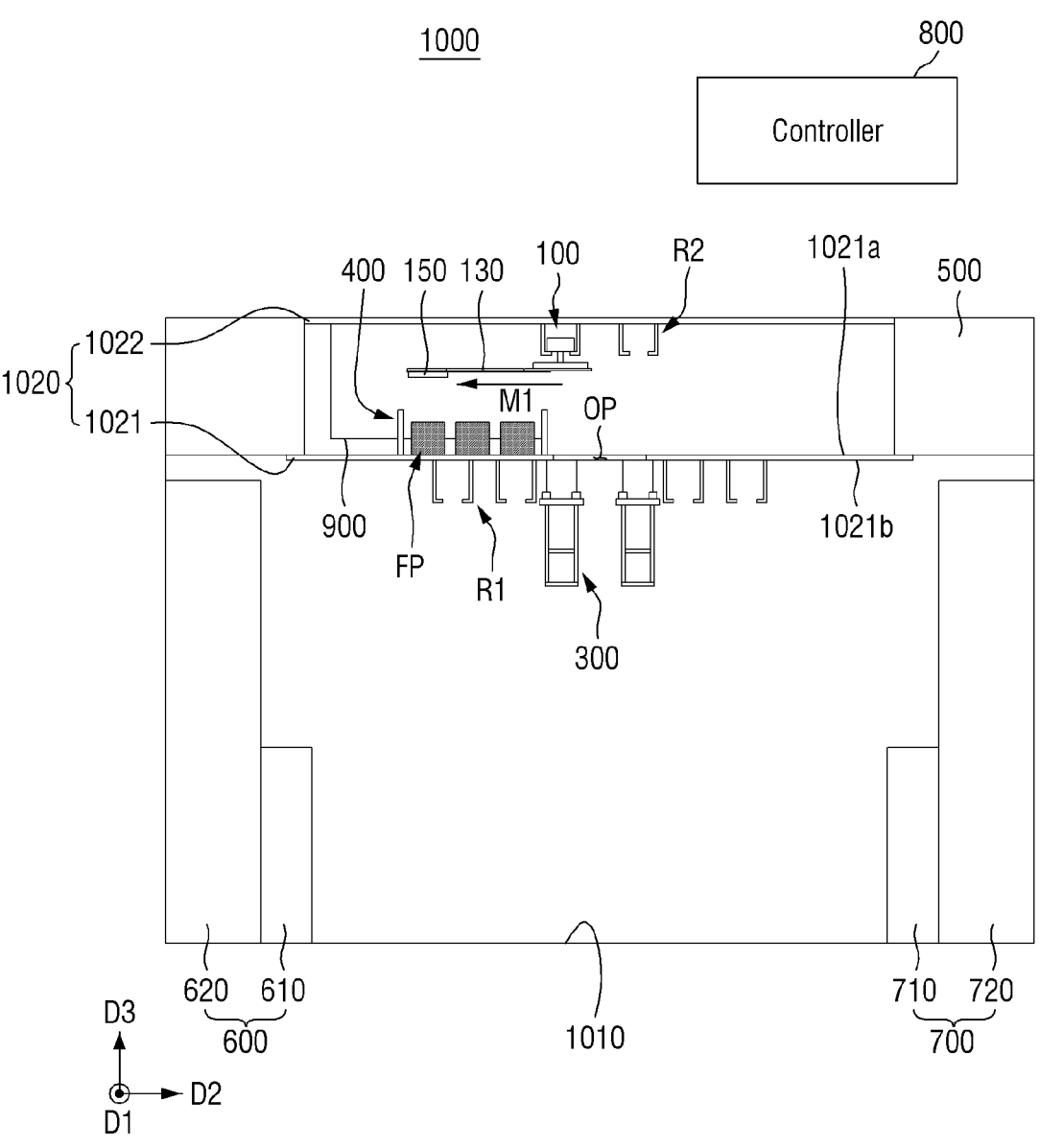
FIGS. 12, 13, 14, 15, 16 and 17 are diagrams for explaining the method of operating the wafer storage and transport system according to some example embodiments.
Figure 13:
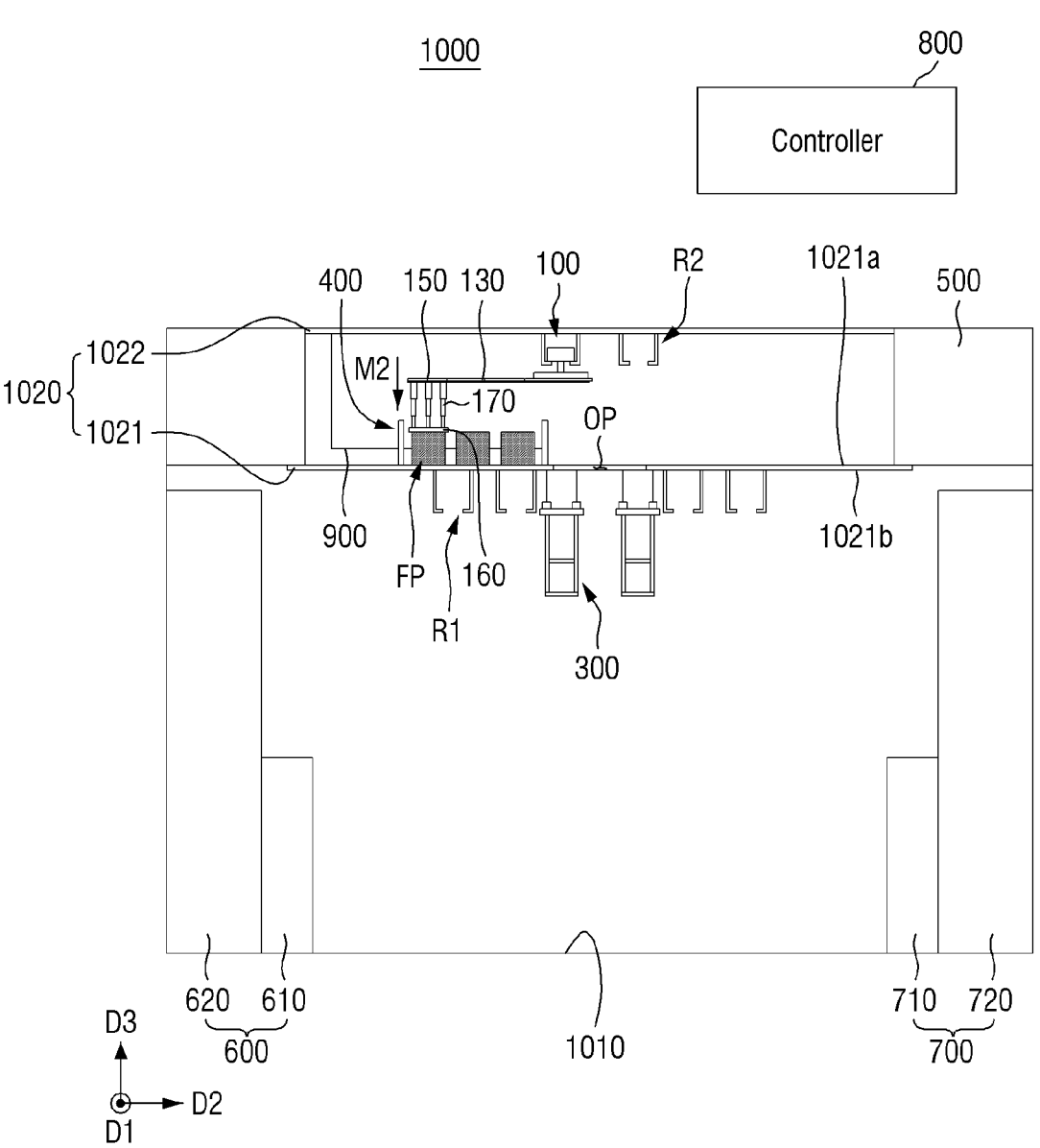

Next, referring to FIGS. 11, 12, and 13, if there is a FOUP (FP) in the storage space 400, the transport unit 100 may grasp the FOUP (FP), using the horizontal arm 130 and the vertical arm 170 (S112).

In the example embodiment shown in FIG. 12, the horizontal arm 130 of the transport unit 100 may slide in the second direction D2 (see reference character M1). The horizontal arm 130 of the transport unit 100 may slide to a desired position of FOUP (FP). For example, in FIG. 12, the horizontal arm 130 of the transport unit 100 may slide to the position of the outermost FOUP (FP) on the basis of the interface port 300.

In the example embodiment shown in FIG. 13, the vertical arm 170 of the transport unit 100 may move the plate 150 in the third direction D3 (see reference character M2). The hand 160 attached to the plate 150 may grasp the FOUP (FP).

In some example embodiments, grasping of the FOUP (FP) stored in the storage space 400 by the transport unit 100 may include extension of the horizontal arm 130 in the second direction D2 (see reference character M1) and extension of the vertical arm 170 in the third direction D3 (see reference character M2).

Figure 14:
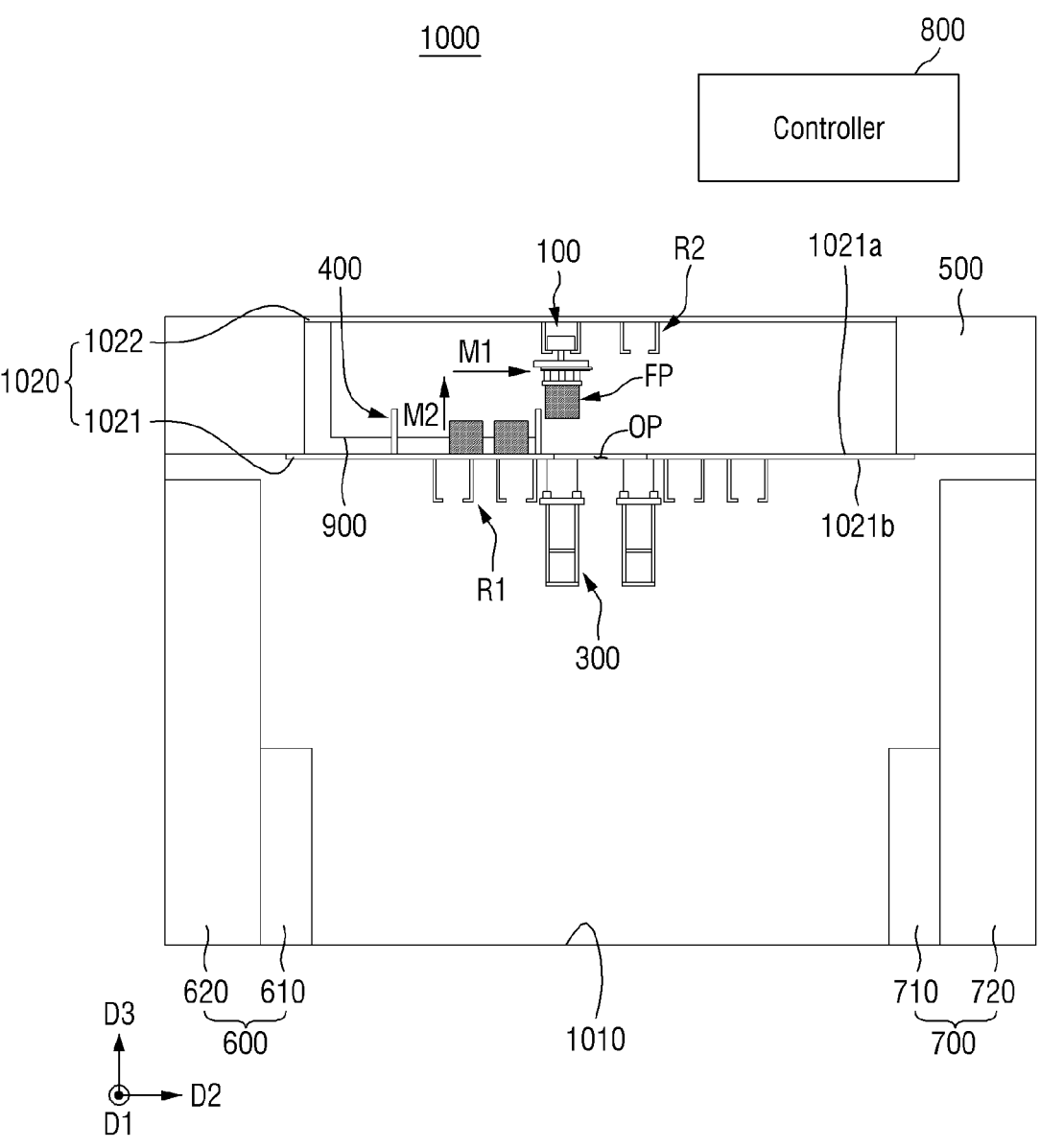

Next, referring to FIGS. 11 and 14, the transport unit 100 may be moved to the desired interface port 300 (S114). First, the grasped FOUP (FP) may be moved to the main body of the transport unit 100, using the vertical arm 170 and the horizontal arm 130 (see reference characters M1 and M2).

The transport unit 100 may then move in the first direction D1 and move to the top of the desired interface port 300. The transport unit 100 may be located on the interface port 300. That is, the transport unit 100 may move to a position at which it overlaps the interface port 300 in the third direction D3.

Next, it may be checked whether there is a FOUP (FP) in the interface port 300 (S115). If the FOUP (FP) is already placed on the interface port 300, the transport unit 100 may move to another interface port 300 (S116). After (S116), the operation of checking whether there is a FOUP (FP) in another interface port 300 may be repeated.

If there is no FOUP (FP) in the interface port 300, the FOUP (FP) may be loaded into the interface port 300, using the horizontal arm 130 and the vertical arm 170 (S117).

Figure 15:
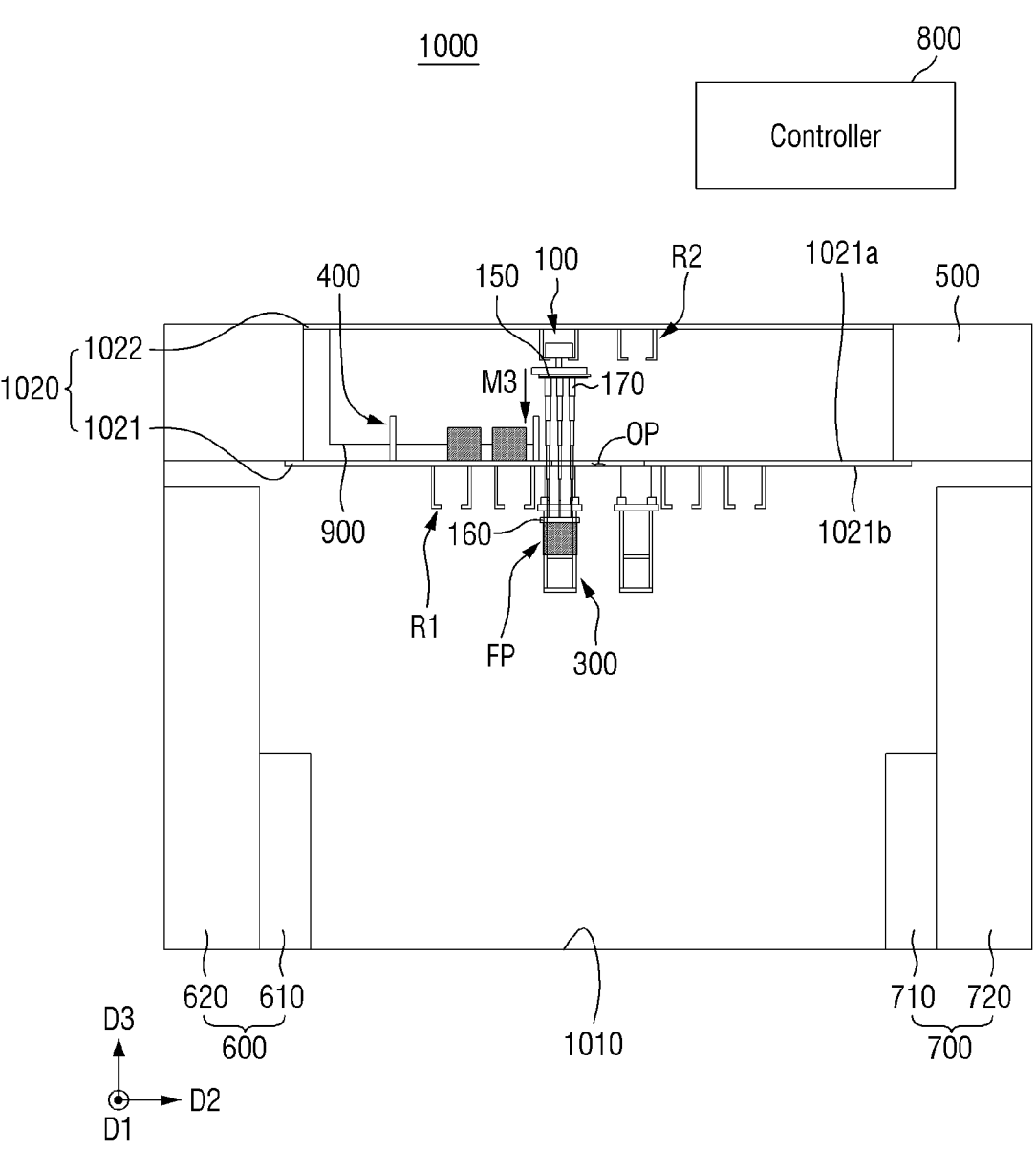

For example, referring to the example embodiment shown in FIG. 15, the vertical arm 170 may extend in the third direction D3 (see reference character M3). The vertical arm 170 may extend in the third direction D3 and load the FOUP (FP) into the interface port 300. At this time, the FOUP (FP) may be loaded into the FOUP seating part of the interface port 300 (320 of FIG. 8).

In some example embodiments, the loading of the FOUP (FP) into the interface port 300 by the transport unit 100 includes only extension of the vertical arm 170 in the third direction D3. At this time, the horizontal arm 130 may not extend in the second direction D2. In another example embodiment, loading of the FOUP (FP) into the interface port 300 by the transport unit 100 may include both extension of the vertical arm 170 in the third direction D3 and extension of the horizontal arm 130 in the second direction (D2).

Figure 16:
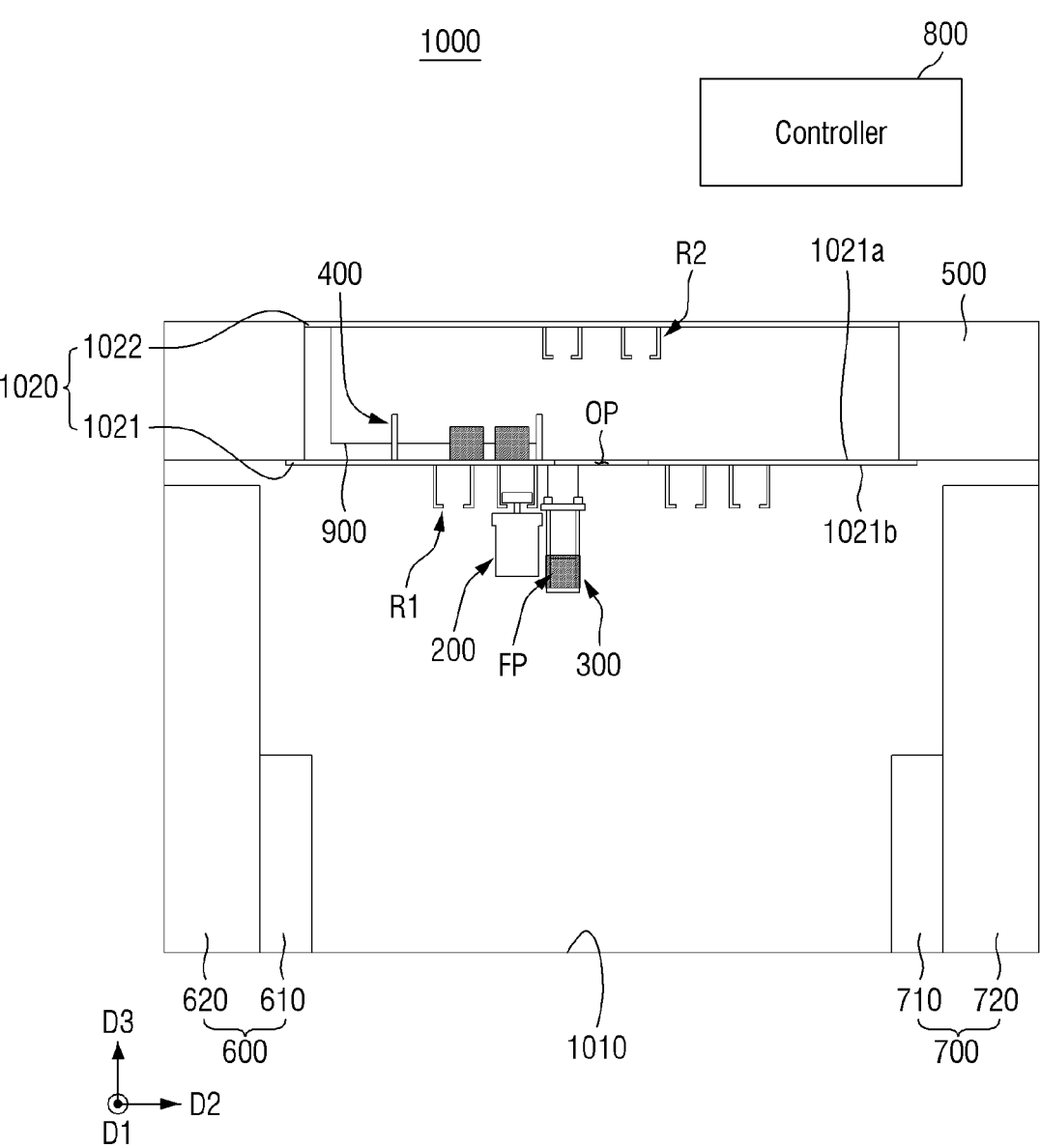

Next, referring to the example embodiments shown in FIGS. 11 and 16, the OHT 200 may move to the corresponding interface port 300 (S118). The OHT 200 may move along the first traveling rail R1.

Next, it may be checked whether there is a FOUP (FP) in the interface port 300 (S119). If there is no FOUP (FP) in the interface port 300, the OHT 200 may wait (S121). Then, it may be checked whether there is a FOUP (FP) in the interface port 300 again.

If there is a FOUP (FP) in the interface port 300, it may be checked whether the transport unit 100 is working on the corresponding interface port 300 (S120). If the transport unit 100 is working on the corresponding interface port 300, the OHT 200 may wait (S122). Further, it may be checked again whether the transport unit 100 is working on the interface port 300.

If the transport unit 100 is not working on the corresponding interface port 300, the OHT 200 may grasp the FOUP (FP) stored in the interface port 300 (S123). The OHT 200 may grasp the FOUP (FP), using the OHT hand (260 of FIG. 7) of the OHT 200.

Figure 17:
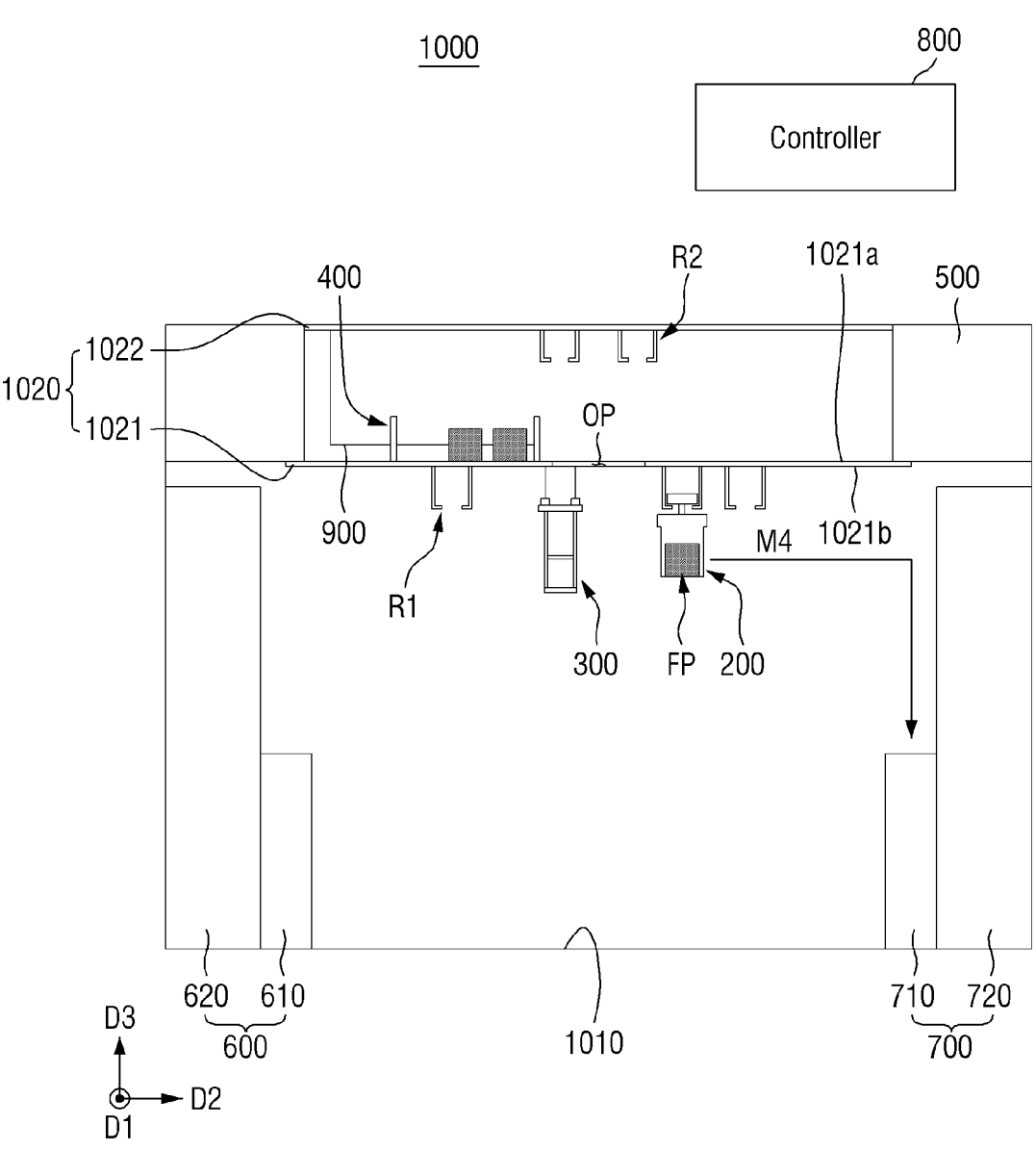

Referring to FIGS. 11 and 17, the FOUP (FP) may be loaded into the semiconductor facility 700 (S124).

The OHT 200 may move to a position adjacent to the semiconductor facility 700 along the first traveling rail R1. The OHT 200 may load the FOUP (FP) into the front module 710 of the semiconductor facility 700 (see reference character M4). The front module 710 may load the FOUP (FP) into the main module 720. Various semiconductor processes may then be performed in the main module 720.

When using the wafer storage and transport system 1000 according to some example embodiments, the number of wafer storage devices installed on the bottom surface 1010 of the semiconductor fab (FAB) can be reduced. Additionally, according to some example embodiments, the wafers may be stored in the space on the ceiling surface 1020 of the semiconductor fab (FAB).

Accordingly, according to some example embodiments, the footprint of the semiconductor fab (FAB) can be reduced. Also, according to some example embodiments, the maximum quantity of storable wafers may be increased.

While aspects of example embodiments have been particularly shown and described, it will be understood that various changes in form and details may be made therein without departing from the spirit and scope of the following claims. Therefore, the disclosed example embodiments of the disclosure are used in a generic and descriptive sense only and not for purposes of limitation.

What is claimed is:

1. A wafer storage and transport system comprising:
   a ceiling comprising a first surface and a second surface opposite to the first surface;
   a first traveling rail installed on the second surface;
   a second traveling rail spaced apart from the first surface in a third direction, and extending in a first direction;
   a transport unit which is movable in the first direction along the second traveling rail, and configured to transport a Front Opening Unified Pod (FOUP);
   storage spaces installed on the first surface and configured to store the FOUP such that the FOUP is arranged inside the storage spaces in the first direction and a second direction, and the FOUP is not arranged in the third direction;
   an interface port installed on the second surface and configured to temporarily store the FOUP; and
   an Overhead Hoist Transport (OHT) which is movable along the first traveling rail,
   wherein the transport unit is further configured to grasp the FOUP arranged in the storage spaces and transport the FOUP to the interface port, and
   wherein the OHT is configured to grasp the FOUP temporarily stored in the interface port and transport the FOUP to a semiconductor facility.

2. The wafer storage and transport system of claim 1, wherein the FOUP is arranged inside the interface port in the first direction and is not arranged in the second direction and the third direction.

3. The wafer storage and transport system of claim 1, wherein the interface port is installed between the storage spaces.

4. The wafer storage and transport system of claim 1, wherein the transport unit comprises:
   a pair of horizontal arms which are extendable in the second direction;
   a hand configured to grasp the FOUP;

a plate which is connected to the pair of horizontal arms and fixes the hand; and
a sub-arm which is connected to the plate and a main body of the transport unit, is extendable in the second direction, and has elasticity.

5. The wafer storage and transport system of claim 4, wherein the pair of horizontal arms comprises a first arm and a second arm, and
   wherein a distance between the first arm and the second arm in the first direction narrows, as the first arm and the second arm extend away from the main body of the transport unit in the second direction.

6. The wafer storage and transport system of claim 4, wherein the transport unit further comprises a vertical arm which is extendable in the third direction and configured to move the plate in the third direction, and
   wherein a diameter of the vertical arm narrows, as the vertical arm extends away from the main body of the transport unit in the third direction.

7. The wafer storage and transport system of claim 1, wherein the transport unit does not overlap the storage spaces in the third direction.

8. The wafer storage and transport system of claim 1, wherein a number of FOUPs arranged inside the storage spaces in the second direction is three to six.

9. The wafer storage and transport system of claim 1, wherein the storage spaces and the semiconductor facility do not overlap in the third direction.

10. The wafer storage and transport system of claim 1, wherein the first traveling rail and the second traveling rail are not connected to each other.

11. The wafer storage and transport system of claim 1, wherein the OHT is configured to travel between the interface port and the semiconductor facility under control of a controller.

12. The wafer storage and transport system of claim 1, wherein the transport unit is configured to travel between the interface port and the storage spaces under control of a controller.

13. The wafer storage and transport system of claim 1, further comprising:
   a piping connected to the storage spaces,
   wherein the piping is configured to supply nitrogen (N$_2$) to the FOUP.

14. A wafer storage and transport system comprising:
   a first ceiling which comprises a first surface, a second surface opposite to the first surface, and an opening;
   a second ceiling which is spaced apart from the first ceiling in a third direction;
   a transport unit which is provided below the second ceiling and is movable in a first direction, the transport unit being configured to transport a Front Opening Unified Pod (FOUP), and the transport unit comprises:
      a pair of horizontal arms extendable in a second direction; and
      a vertical arm extendable in the third direction;
   a storage space which is installed on the first surface and configured to store the FOUP such that the FOUP is arranged inside the storage space in the first direction and the second direction, and the FOUP is not arranged in the third direction;
   an interface port installed on the second surface in a region that overlaps the opening in the third direction, and configured to temporarily store the FOUP such that the FOUP is arranged in a line inside the interface port in the first direction; and an Overhead Hoist Transport (OHT) which is movable along a first traveling rail installed on the second surface, wherein the transport unit is installed in a region that overlaps the interface port in the third direction, wherein the transport unit is further configured to extend the pair of horizontal arms in the second direction, extend the vertical arm in the third direction to grasp the FOUP arranged in the storage space, and transport the grasped FOUP by extending the vertical arm in the third direction to the interface port, wherein the pair of horizontal arms comprises a first arm and a second arm, and a distance between the first arm and the second arm in the first direction narrows, as the first arm and the second arm extend away from a main body of the transport unit in the second direction, wherein a diameter of the vertical arm narrows, as the vertical arm extends away from the main body of the transport unit in the third direction, and wherein the OHT is configured to transport the FOUP temporarily stored in the interface port to a semiconductor facility.

15. The wafer storage and transport system of claim 14, wherein the transport unit further comprises:

a hand which is configured to grasp the FOUP;

a plate which is connected to the pair of horizontal arms and which fixes the hand; and a sub-arm which is connected to the plate and the main body of the transport unit, and has elasticity.

16. The wafer storage and transport system of claim 14, further comprising:

a piping connected to the storage space, wherein the piping is configured to supply nitrogen ($N_2$) to the FOUP.

17. The wafer storage and transport system of claim 14, further comprising:

a second traveling rail which is installed below the second ceiling, is not connected to the first traveling rail, and extends in the first direction, wherein the transport unit is further configured to travel along the second traveling rail.

18. The wafer storage and transport system of claim 14, wherein the OHT is further configured to travel between the interface port and the semiconductor facility under control of a controller, and wherein the transport unit is further configured to travel between the interface port and the storage space under control of the controller.

19. A method of operating a wafer storage and transport system, the method comprising:

moving a transport unit along a second traveling rail in a first direction under control of a controller, wherein the transport unit comprises a pair of horizontal arms extendable in a second direction and a vertical arm extendable in a third direction, grasping, by the transport unit, a Front Opening Unified Pod (FOUP) stored in storage spaces installed on a first surface of a ceiling and loading the FOUP into an interface port placed between the storage spaces, the FOUP being arranged inside the storage spaces in the first direction and the second direction and not being arranged in the third direction, and the FOUP being arranged in a line inside the interface port in the first direction;

moving an Overhead Hoist Transport (OHT) to the interface port along a first traveling rail spaced apart from the second traveling rail in the third direction under control of the controller, the first traveling rail being installed on a second surface of the ceiling; and grasping, by the OHT, the FOUP temporarily stored in the interface port and transporting the FOUP to a semiconductor facility, wherein the grasping, by the transport unit, the FOUP stored in the storage spaces comprises extending the pair of horizontal arms in the second direction and extending the vertical arm in the third direction, and wherein the loading, by the transport unit, the FOUP into the interface port comprises extending the vertical arm in the third direction.

20. The method of claim 19, wherein the pair of horizontal arms comprises a first arm and a second arm, wherein a distance in the first direction between the first arm and the second arm narrows, as the first arm and the second arm extend away from a main body of the transport unit in the second direction, and wherein a diameter of the vertical arm narrows, as the vertical arm extends away from the main body of the transport unit in the third direction.

* * * * *